United States Patent
Takeuchi et al.

(10) Patent No.: US 6,502,302 B2
(45) Date of Patent: Jan. 7, 2003

(54) PROCESS FOR PRODUCING AN INDUSTRIAL MEMBER HAVING THROUGHHOLES OF HIGH ASPECT RATIO

(75) Inventors: Yukihisa Takeuchi, Nagoya (JP); Hiroyuki Tsuji, Nagoya (JP); Kazumasa Kitamura, Nagoya (JP); Yoshinori Yamaguchi, Nagoya (JP)

(73) Assignee: NGK Insulators, Ltd., Nagoya (JP)

( * ) Notice: Subject to any disclaimer, the term of this patent is extended or adjusted under 35 U.S.C. 154(b) by 0 days.

(21) Appl. No.: 09/771,223

(22) Filed: Jan. 26, 2001

(65) Prior Publication Data
US 2002/0020057 A1 Feb. 21, 2002

(30) Foreign Application Priority Data
Jul. 19, 2000 (JP) ..................................... 2000-218378
Sep. 14, 2000 (JP) ..................................... 2000-280573

(51) Int. Cl.[7] .............................................. H05K 3/36
(52) U.S. Cl. ............................. 29/830; 29/846; 29/852; 29/861
(58) Field of Search ............................. 29/830, 33 K, 29/846, 847, 852, 861, 432, 429; 174/262, 259; 156/150

(56) References Cited

U.S. PATENT DOCUMENTS

| | | | | |
|---|---|---|---|---|
| 3,803,697 A | * | 4/1974 | Baker et al. | 29/203 B |
| 4,192,063 A | * | 3/1980 | Sato | 29/591 |
| 4,432,037 A | * | 2/1984 | Brabetz | 361/410 |
| 4,564,986 A | * | 1/1986 | Peterson | 29/33 K |
| 4,650,951 A | * | 3/1987 | Koga et al. | 219/118 |
| 5,305,523 A | * | 4/1994 | Bross et al. | 29/832 |
| 5,456,004 A | * | 10/1995 | Swamy | 29/852 |
| 5,678,970 A | * | 10/1997 | Caulk | 411/504 |
| 5,925,206 A | * | 7/1999 | Boyko et al. | 156/150 |
| 6,066,226 A | * | 3/2000 | Nagata et al. | 156/251 |
| 2002/0038507 A1 | * | 4/2002 | Takeuchi et al. | 29/830 |

FOREIGN PATENT DOCUMENTS

| | | | | |
|---|---|---|---|---|
| JP | 59-198853 | * | 11/1984 | |
| JP | 3-46393 | * | 2/1991 | 29/829 |
| JP | 9-19914 | * | 1/1997 | |

OTHER PUBLICATIONS

U.S. application Ser. No. 10/128,152, Takeuchi et al., filed Apr. 23, 2002, Docket No. 791_195.

* cited by examiner

Primary Examiner—Carl J. Arbes
Assistant Examiner—Minh Trinh
(74) Attorney, Agent, or Firm—Burr & Brown

(57) ABSTRACT

A fabrication method of an industrial part having high-aspect-ratio through-hole sections using a punch and a die, includes a first step of drilling a first hole section in a first sheet of sheet material with the above punch; a second step of lifting the above first sheet in tight contact with a stripper; a third step of lifting a tip section of the above punch so as to be slightly drawn in from a bottom section of the above lifted first sheet; a fourth step of drilling a second hole section in a second sheet of sheet material with the above punch; a fifth step of lifting the above second sheet in tight contact with the above first sheet; a sixth step of lifting the tip section of the above punch so as to be slightly drawn in from the bottom section of the above lifted second sheet, and, the subsequent steps of repeating the above fourth to sixth steps for lamination of a plurality of sheets of sheet material. Industrial parts may be fabricated, where fine through-hole sections, in which their diameter is very small, for example, 100 $\mu$m or less, and their axial length is longer by a predetermined mount or more compared with that of their diameters, are provided at high density with similar accuracy to that of hole sections drilled in one sheet of thin sheet material, even when using soft material which can be deformed.

7 Claims, 5 Drawing Sheets

FIG.3(b) - Prior Art
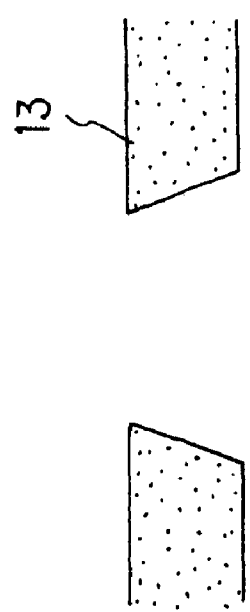
FIG.3(a) - Prior Art
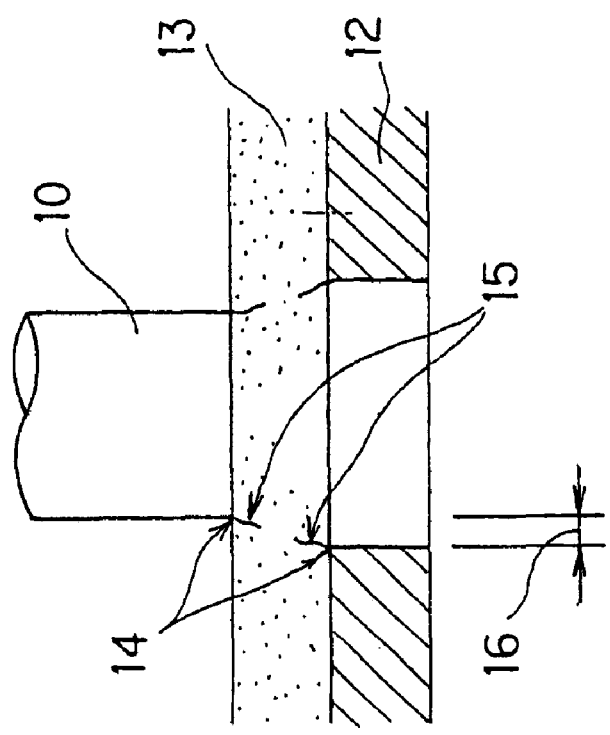

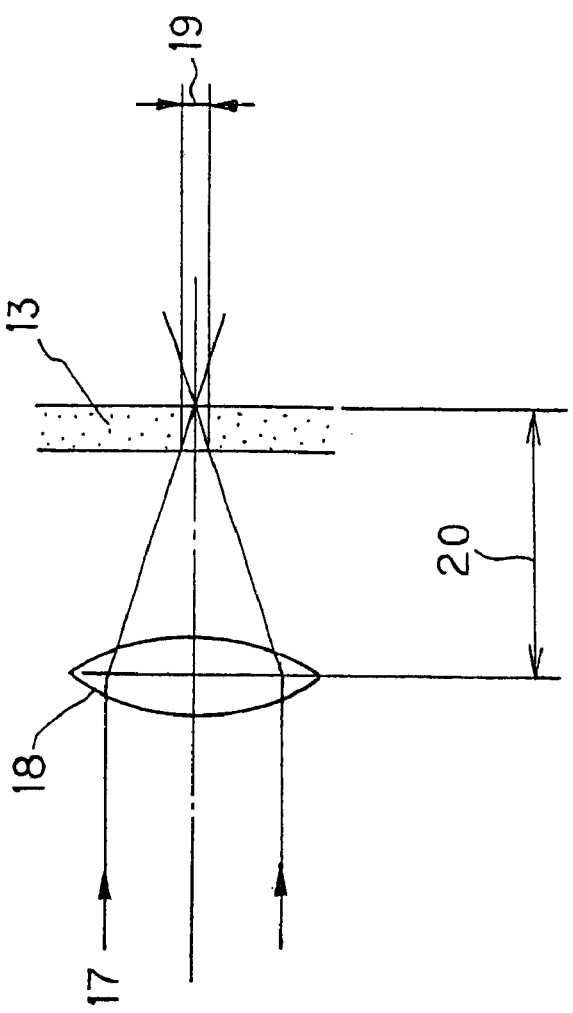
FIG. 4(a) - Prior Art
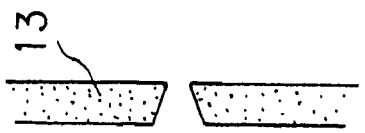
FIG. 4(b) - Prior Art

PROCESS FOR PRODUCING AN INDUSTRIAL MEMBER HAVING THROUGHHOLES OF HIGH ASPECT RATIO

BACKGROUND OF THE INVENTION AND RELATED ART

The present invention relates to a method for fabrication of industrial parts having high-aspect-ratio through-hole sections at high density, and, more specifically, when using a soft material which is deformed by handling after blanking, to a method for fabrication of industrial parts by which many high-aspect-ratio through-hole sections are formed into industrial parts with a predetermined thickness, with a similar high accuracy to that of hole sections drilled in a thin sheet material.

Reduction in cost, weight, and size has been commonly required in all industrial products, and, especially in industrial products equipped with many electrical circuits, a small size has been necessary for additional value to cause remarkable developments in packaging technologies for these circuits. Among these developments, small through-hole sections of the order of $\mu$m have been required to be fabricated with good accuracy for wiring boards having electronic components mounted thereon so as to more densely integrate electronic circuits, while considering cooling effects, and to secure high reliability. Moreover, technologies to accurately drill small through-hole sections in industrial parts have been indispensable, for example, holes smaller than those of wiring boards, have been required to be drilled with very high accuracy for ink ejecting sections of inkjet printers.

Recently, there have been much more densely integrated electronic circuits, and it has been necessary to drill a larger number of small holes in a predetermined area of material substrates. Then, it has been necessary for the through-hole sections to be smaller and deeper in the hole dimension, in other words, for the diameter to be smaller and the axial length (depth) of the above through-hole sections to be longer. That is, it has been necessary for those aspect ratios to be higher. Therefore, it has been required to form the through-hole sections with high accuracy. Generally, the aspect ratio denotes the ratio of the diameter to the axial length of the hole when the cross section of the hole is a circle, and that of the shortest distance between mutually opposing edges of the hole to the axial length when not a circle. Here, the shortest distance between the mutually opposing edges of the hole is the shortest one S in FIGS. 5(a) and 5(b). That is, a high-aspect-ratio through-hole section means a long and narrow hole with a long axial length compared with the diameter or the shortest distance of the hole.

Hole-drilling with a blanking die may be listed as one conventional method for drilling a large number of small holes in such a sheet material. The above drilling is a method for making industrial parts by performing, at one time, blanking of a sheet material with a predetermined thickness using a punch and a die. In the above method, there has been a problem of poor accuracy as a thick sheet material is treated as a blanking object from the beginning, requiring a large clearance between the punch and the die. Moreover, a shearing force larger than that of a thin sheet material is applied during blanking, and a large number of holes are required, especially for the die, when the through-hole sections are formed with a high density. Therefore, the strength of the die may not withstand the above large shearing force, deformation may be caused due to shortage of the rigidity, and, furthermore, the problem of damage may also occur.

FIG. 3 shows a drilling state of a through-hole section with a blanking die. As shown in FIG. 3(a), cracks 15 are caused from each edge 14 of a punch 10 and a die 12 during blanking, when the punch 10 performs blanking of a sheet material 13 put on the die 12 after provision of a clearance 16 as a space between the punch 10 and the die 12. That is, the cracks 15 are generated in the vicinity of the clearance 16, and the accuracy of the hole varies within the range of the clearance 16. Thereby, according to the method for drilling of through-hole sections with the blanking die, the cross section of the through-hole sections of a sheet material after blanking is generally tapered in the blanking direction, as shown in FIG. 3(b).

The clearance 16 for the blanking die is required to be larger for a thicker sheet material, for example, 4–12% of the sheet thickness for thin sheets, and 18–26% of the sheet thickness for thick sheets, according to "BASIC MACHINING (I)", published by THE NIKKAN KOGYO SHIMBUN LTD. That is, the accuracy of holes is reduced for a thick sheet material, as described above. Therefore, the above methods are not suitable for high-density drilling of high-aspect-ratio, small through-hole sections, as the sizes of the diameters at the exit side in the blanking direction are uneven.

As an improved method for hole drilling with the above blanking die, there has been a method for obtaining industrial parts with a predetermined thickness, by which, after the thin sheet materials undergo blanking, the thin sheet materials are transferred and laminated. In the above method, since the sheet thickness of the material for blanking at one time is thin, resulting in superior accuracy of the holes for each sheet of sheet material in each blanking and reduced shearing force caused by the punch and the die, holes may be drilled very densely. However, there are problems of low production efficiency and high cost, as jigs for transferring the sheet materials and space for lamination are required, and there are an increased number of machining steps. Moreover, since guide pins are needed for precise lamination, waste is also caused by drilling holes other than the necessary through-hole sections in the industrial parts. Furthermore, when using a soft material which can be deformed after blanking, and when the industrial parts are laminated to a predetermined thickness, gaps occur between holes after transfer and lamination and the problem of reduced accuracy of the holes occurs. Therefore, the above method is not suitable for very dense drilling of high-aspect-ratio, small through-hole sections.

As another conventional method, there is a method for hole drilling with a laser beam, not using the blanking die. It is machining with a laser beam, that is, a machining method in which a work material is exposed to the laser beam after the above beam is focussed with a lens. According to the above machining with the laser beam, there is a fundamental problem of poor accuracy in the case of the high-aspect-ratio through-hole sections, as the through-hole sections are tapered in the propagating direction of the laser beam due to the laser beam focussing method.

FIG. 4 shows a drilling state of a through-hole section formed by laser beam machining. As shown in FIG. 4(a), in a laser machining apparatus, a parallel beam light 17 passes through a condensing lens 18 and is focussed for machining at position of a focal distance 20. A greater distance from the focus causes the laser beam width 19 to become broader, that is, the diameter of the machined hole becomes larger. Thereby, in the case of a larger thickness of the sheet material, while the hole at the exit side in the propagating direction of the laser beam is being drilled, a hole with a larger diameter is drilled at the entrance side in the propagating direction of a laser beam. As a result, a tapered through-hole section will be formed, as shown in FIG. 4(b).

Moreover, as thermal energy is used for the laser beam machining, a sheet material to be machined is deformed by the effect of heat, and an altered layer is formed. Thereby, another problem of uneven hole diameters also occurs. Even in the above problem, a larger thickness of the sheet material causes a lower accuracy of the holes, as the sheet material with the larger thickness requires a larger amount of laser beam energy, that is, a larger amount of thermal energy. Therefore, it is also difficult to say that the above laser beam machining is suitable as a method for high- density drilling of high-aspect-ratio through-hole sections.

As described above, there have been many developments in higher density mounting technology for industrial fields, especially for electronic components, and, in industrial parts for which fine through-hole sections are required to be drilled at high density, methods for making high-aspect-ratio through-hole sections with no damage, more safely and with higher accuracy have been required, even when using a soft material having a dimension or a shape in which deformation may be caused by handling after hole drilling. However, suitable methods have not been proposed.

SUMMARY OF THE INVENTION

The present invention has been made, considering the above problems, and the object is to solve the problems in conventional technologies, and, to contribute to increased density packaging of industrial parts, especially, of electronic equipment, by provision of industrial parts having a predetermined thickness and a plurality of high-aspect-ratio, small through-hole sections, based on a configuration where, even when using soft material which can be deformed, there may be drilled fine through-hole sections with a narrow diameter, for example, 100 μm or less, and with an axial length whose ratio with respect to the diameter is larger than a predetermined ratio; and the above drilling is performed with similar accuracy to that of through-hole sections drilled in one sheet of thin sheet material, and approximately in a cylindrical shape which are formed in a straight line.

The inventors of the present invention have examined various kinds of methods and fabrication steps for hole-drilling of a sheet material with a blanking die, and found that the following fabrication method achieves the above purpose: in a die blanking method for drilling a hole section in a sheet material, using a punch and a die, the above material is lifted in tight contact with a stripper under a state where the punch is not pulled out from the hole section, after drilling of the hole section in the sheet of sheet material with the punch; the punch lifted from the die is returned so as to be slightly drawn in from a bottom section of the hole section; similarly, the subsequent material is lifted in tight contact with the lower section of the previous sheet material, while being laminated on each other, under a state where the punch is not pulled out from the hole section, after drilling of the hole section with the punch; the punch lifted from the die is returned so as to be slightly drawn in from the bottom section of the hole section; and the above steps are repeated to laminate a plurality of sheets of sheet material with drilled holes in a device with the punch and the die.

That is, the present invention provides a fabrication method of an industrial part having high-aspect-ratio through-hole sections, using a punch and a die, including: a first step of drilling a first hole section in a first sheet of sheet material with the punch; a second step of lifting the above first sheet in tight contact with a stripper; a third step of lifting a tip section of the punch so as to be slightly drawn in from a bottom section of the lifted first sheet of sheet material; a fourth step of drilling a second hole section in a second sheet of sheet material with the punch; a fifth step of lifting the above second sheet in tight contact with the above first sheet; and a sixth step of lifting the tip section of the punch so as to be slightly drawn in from the bottom section of the lifted second sheet of sheet material; and, characterized in that the above fourth to sixth steps are repeated for bonding and lamination of a plurality of sheets of sheet material.

In the present invention, the accuracy of the above through-hole sections which are drilled in the above industrial part may be arranged to be similar to that of hole sections drilled in the above one sheet of sheet material.

Moreover, in the present invention, it may be possible to form high-aspect-ratio through-hole sections, that is, the ratio of the diameters, or the shortest distances from one edge to the opposing edge of the above through-hole sections to the axial lengths, approximately 1:1–1:7, and also to form through-hole sections with the ratio of the distance between the through-hole sections adjacent to each other to the axial length of the above corresponding sections approximately, 1:1–1:7. Moreover, it may be possible to form high-aspect-ratio through-hole sections, where the diameter of the above sections is 100 μm or less; and also to form high-aspect-ratio through-hole sections, where the distance between through-hole sections adjacent to each other is 100 μm or less.

In the present invention, sheets of sheet material to be laminated may be bonded to each other by using the above sheet material with a bonding agent previously applied thereto, or by inserting a bonding sheet between the sheets of sheet material. Furthermore, each sheet material may be laminated in tight contact with each other, using vacuum suction, after previous drilling of holes in the above sheet material for vacuum suction.

BRIEF DESCRIPTION OF THE DRAWINGS

FIG. 1(a) shows a preparation step for a first sheet of thin sheet material where the first sheet is put on a die; FIG. 1(b) shows a blanking step for the first sheet where the first sheet is blanked with a die; FIG. 1(c) shows a preparation step for a second sheet; FIG. 1(d) shows a blanking step for the second sheet; and FIG. 1(e) shows a sheet blanking completion step where the laminated sheets are separated from a stripper after completion of blanking and lamination of the sheets.

FIG. 2(a) shows a perspective view of one embodiment of the industrial part having high-aspect-ratio through-hole sections; and FIG. 2(b) shows an enlarged view of the high-aspect-ratio through-hole sections shown in FIG. 2(a).

FIGS. 3(a), and 3(b) show a view of drilling of a through-hole section with a blanking die according to a conventional method; FIG. 3(a) shows a schematic view of a state of generated cracks; and FIG. 3(b) shows an explanatory view of a cross section of the through-hole section of a sheet material blanking.

FIGS. 4(a), and 4(b) show a view of drilling of a through-hole section with laser beam machining according to a conventional method; FIG. 4(a) shows a schematic view of a fabrication state with a laser beam; and FIG. 4(b) shows an explanatory view of a cross-section of the through-hole section after laser beam machining.

FIG. 5(a) is an explanatory view showing one example of the shortest distance of the hole; and FIG. 5(b) is an explanatory view showing another example of the shortest distance of the hole.

DESCRIPTION OF THE PREFERRED EMBODIMENT

Hereinafter, embodiments of a method for fabrication of industrial parts having high-aspect-ratio through-hole sections according to the present invention will be described in detail. However, the present invention is not limited to the above embodiments, and various kinds of modifications, corrections, and improvements may be added based on the knowledge of those skilled in the art without departing from the spirit and scope of the present invention.

The present invention is characterized in that thin sheet materials are laminated in a fabrication device having a punch and a die, using the punch itself as a lamination axis like a guide pin in conventional methods. And, it is also characterized in that, when the tip section of the punch is slightly drawn in from the bottom section of the lifted sheet material, lifting of the punch is stopped so as to prevent deformation of a hole section drilled for each sheet of thin sheet material. In the present invention, it may be possible by the above configuration to form high-aspect-ratio through-hole sections at high density with similar accuracy to that of hole sections drilled in a thin sheet material, even when using a soft material which can be deformed by handling after punching, though a larger thickness causes a lower accuracy of the holes in conventional methods in the case of industrial parts with a predetermined thickness.

Figure 2A:
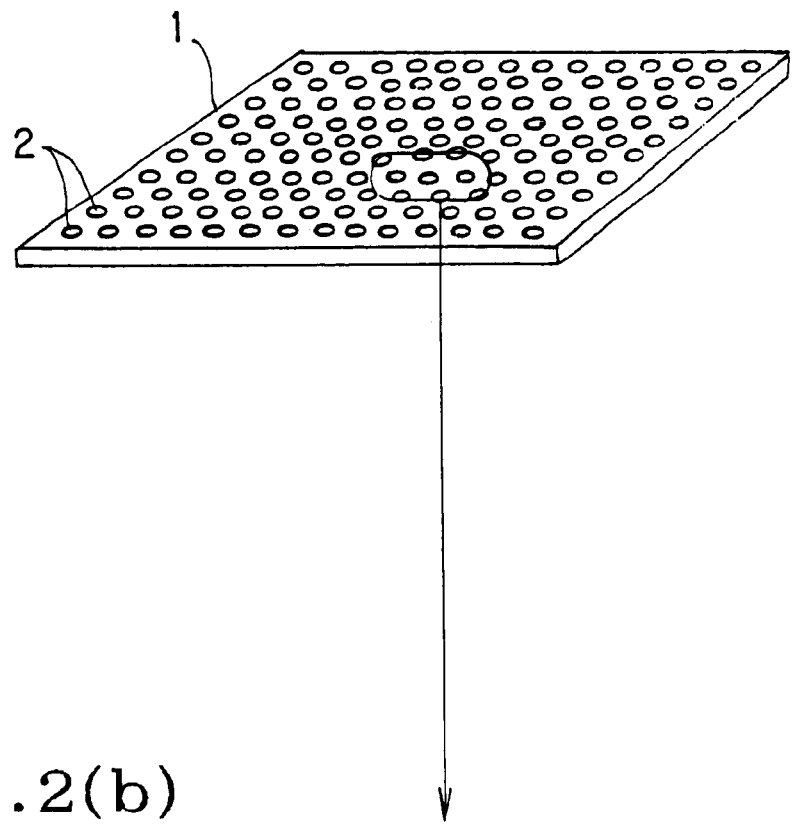
FIGS. 2(a), and 2(b) show a view of an industrial part having high-aspect-ratio through-hole sections according to the present invention.
Figure 2B:
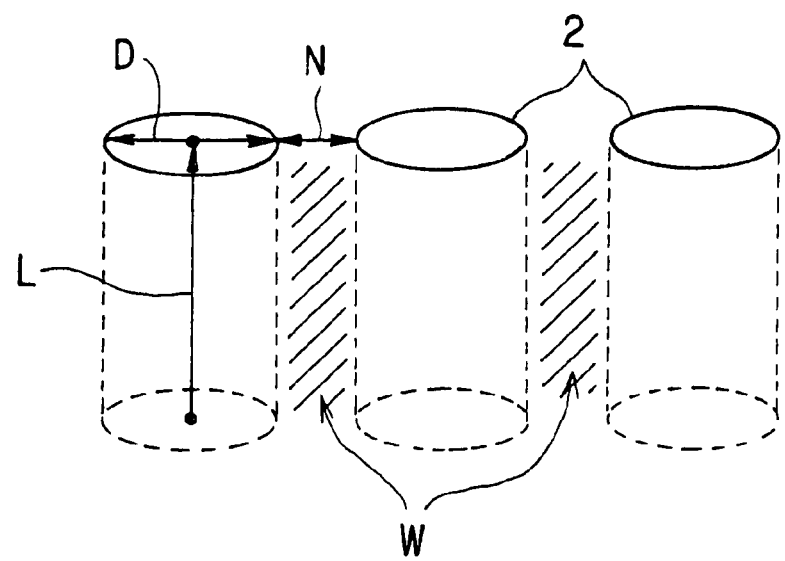
Figure 5A:
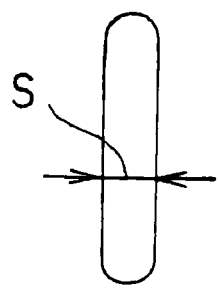
FIGS. 5(a), and 5(b) show a view of industrial parts having high-aspect-ratio through-hole sections according to the present invention.
Figure 5B:
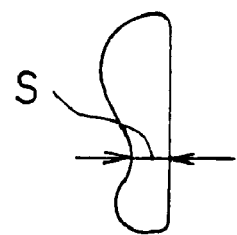

The high density drilled high-aspect-ratio through-hole sections, which are required for wiring boards for electric circuits and ink jet sections for printers and so on are shown in FIG. 2 and described as follows:

FIGS. 2(a), and 2(b) show a view of an industrial part 1 having high-aspect-ratio through-hole sections according to the present invention. FIG. 2(a) shows a view of one embodiment of an industrial part 1 having high-aspect-ratio through-hole sections 2; and FIG. 2(b) shows a enlarged view of a part of the above through-hole sections. In the industrial part 1, it is preferable to form narrow through-hole sections with a ratio of the diameter D to the axial length L of approximately 1:1–1:7. And, in the industrial part 1, it is required to form through-hole sections at high density with a ratio of the distance N between through-hole sections adjacent to each other to the axial length L of the through-hole sections of approximately 1:1–1:7. Both the above diameter D and the above distance N of the through-hole sections are those for a small hole of the order of several tens of $\mu$m. In the industrial part 1, many of such small holes with a dimension of 100 $\mu$m or less are required to be drilled at a spacing of 100 $\mu$m or less with high accuracy, and the above requirements may be realized by the fabrication method of industrial parts having high-aspect-ratio through-hole sections according to the present invention.

Figure 6:
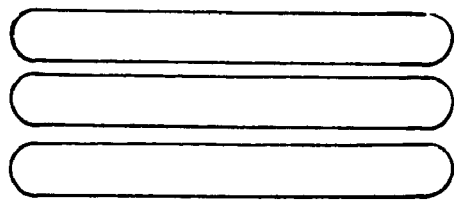
FIG. 6 is an explanatory view showing one example of a cross-section of a high-aspect-ratio through-hole section according to the present invention.

Holes with high accuracy are assumed to be a hole with an approximately constant diameter D of the through-hole sections for all portions of the axial length L of the through-hole sections. In other words, they are holes piercing through the thickness of a sheet material, that is, the through-hole section 2 is configured to be almost cylindrical when the cross-section of the through-hole section 2 is assumed to be a circle. The cross-section of the through-hole sections is not necessarily required to be a circle, for example, it may be a long and narrow ellipse as shown in FIG. 6. That is, any type of cross-sections may be used for the through-hole sections. When the accuracy of holes is low, and through-hole sections 2 are formed at high density formed, two or more through-hole sections are joined by elimination of the distance N between through-hole sections adjacent to each other and/or the strength becomes insufficient by reducing in the above distance. Thereby, deformation, such as bending and/or damage of the wall section W between the through-hole sections 2 adjacent to each other will be caused, and the reliability of the industrial part 1 may be significantly reduced. However, such a problem will not occur according to the fabrication method of industrial parts having high-aspect-ratio through-hole sections according to the present invention, as it is possible to fabricate industrial parts with high accuracy in the shape even when the thickness of the above wall section W is thin.

A soft material having a dimension or a shape, which is fabricated by the method of industrial parts having high-aspect-ratio through-hole sections according to the present invention, and in which deformation is caused by handling after hole drilling, is soft material with, for example, a Young's modulus of less than 3000 kgf/mm$^2$, for example, polyethylene (Young's modulus of 310 kgf/mm$^2$), polyimide (Young's modulus of 430 kgf/mm$^2$), reinforced plastic (Young's modulus of 2500 kgf/mm$^2$), and greensheet (Young's modulus of 4 kgf/mm$^2$). Moreover, even when the Young's modulus is 3000 kgf/mm$^2$ or more, a piece of material, for example, very thin sheet metal having a size or a shape in which deformation is caused by handling after hole drilling, may be used as an object for the present invention.

Then, one embodiment of a fabrication method of industrial parts having high-aspect-ratio through-hole sections according to the present invention will be described while referring to FIGS. 1(a)–1(e).

A blanking machine mainly includes a punch 10, a die 12 and a stripper 11 and each sheet of thin sheet material 3 is put on the die 12 one-by-one for blanking with the punch 10. The quality, size, and thickness of the thin sheet material 3 are not specially limited, and, for example, a greensheet with a thickness of 40 $\mu$m may be used.

Figure 1B:
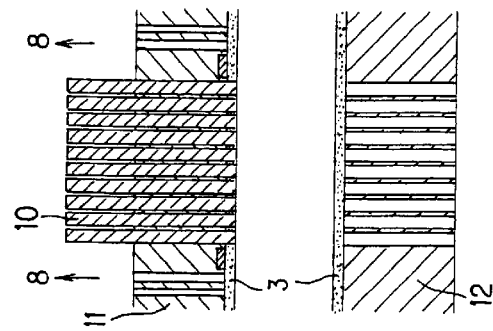
FIGS. 1(a)–1(e) show an explanatory view of steps for one embodiment of a method for fabrication of industrial parts having high-aspect-ratio through-hole sections, using a punch and a die, according to the present invention.
Figure 1C:
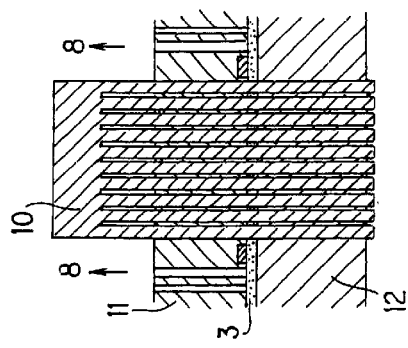
Figure 1E:
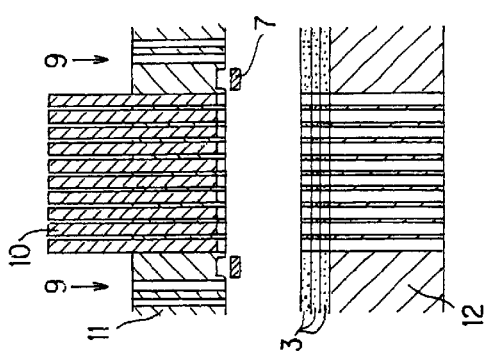
Figure 1A:
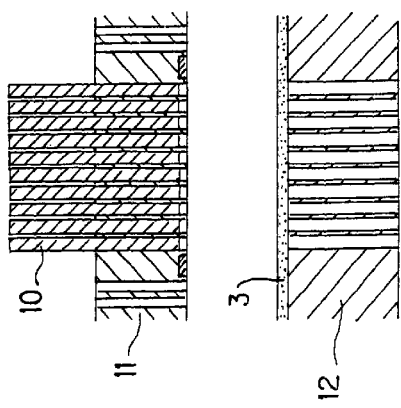

FIG. 1(a) shows a state where a first sheet of thin sheet material 3 is put on a die for preparation of blanking. Then, the first sheet of sheet material 3 is blanked with the punch 10, as shown in FIG. 1(b). Thereafter, preparation for blanking of a second sheet is started as shown in FIG. 1(c), but the first sheet of sheet material 3 is not moved to another place for lamination, in a different manner from that of conventional methods, that is, the above first sheet 3 is moved upward in tight contact with the stripper 11, while being inserted in the punch 10. Vacuum suction 8 using an intake port passing through the stripper 11 as shown in FIG. 1(c) may be used for tight contact of the sheet material 3 with the stripper 11' and bonding of it onto the stripper 11 may be also used, for example, by application of a bonding agent on the surface of the first sheet of sheet material 3.

Here, it is preferable that the punch 10 is not returned into the hole section of the first sheet of sheet material 3 which is lifted together, when the punch 10 and the stripper 11 are lifted from the die 12 as shown in FIG. 1(c), for starting of preparation for blanking of the above second sheet. It is important to stop lifting when the above punch is slightly drawn in from the bottom section of the thin sheet material 3. The hole section is deformed in the sheet material 3 when using soft material, and the accuracy of the hole may be reduced when the sheet material 3 is laminated for the industrial part 1, if the punch 10 is returned into the hole section of the sheet material 3, or it is completely stored in the stripper 12.

Though a method for lamination of thin sheet material is applied, as the punch 10 itself is used as a lamination axis of the thin sheet material, like the guide pin in the conventional methods, and deformation of the drilled hole section is prevented with the punch 10 itself as described above, there is no need for jigs for transferring the sheet material 3 and a lamination space, and, moreover, increase in number of fabrication steps is reduced. Therefore, the industrial part 1 having high-aspect-ratio through-hole sections and with a similar fabrication accuracy to that of holes drilled in a thin sheet material may be fabricated at reduced cost.

Figure 1D:
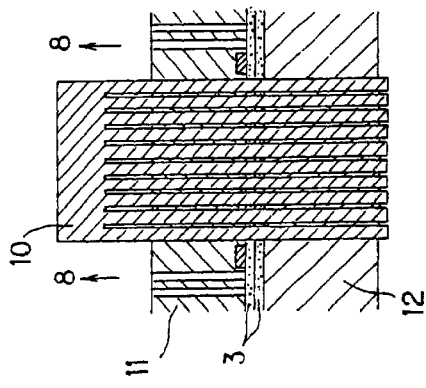

FIG. 1(d) shows a blanking step for the second sheet. Thereafter, preparation for blanking as shown in FIG. 1(c) is performed, and the above operation is repeated for sequential lamination of a plurality of sheets of sheet material 3 in the blanking machine.

As shown in FIG. 1(e), laminated sheets of sheet material 3 are separated from the stripper 11 for completion of blanking, after completion of blanking and lamination of all the sheets of sheet material 3. As a method for removal of the laminated sheet materials 3 from the stripper 11, there may be, for example, a method in which stopping of the vacuum suction for lifting the sheet material 3, vacuum braking, and mechanical separation with a stripping jig 7 are sequentially performed.

There is a need for bonding of the sheet materials 3 on each other for obtaining the industrial part 1 by lamination of the sheet materials 3, and, as a bonding method, previous application of a bonding agent onto the surface of each sheet material 3 for bonding may be performed, and, also, a bonding sheet may be inserted between two sheets of the sheet materials 3 for bonding adjacent to each other. However, a sheet material, which is previously provided with a bonding agent on the surface is preferably used, as there are an increased number of steps for blanking when bonding sheets are used.

For example, when a hole section is drilled in a sheet of green sheet with a thickness of 50 $\mu$m, as a sheet material 3, so as to have a through-hole section with a diameter D of 98 $\mu$m as the through-hole section, and a distance N between the above through-hole sections adjacent to each other of 50 $\mu$m, the clearance between the punch 10 and the die 12 at the sheet material 3 may be of the order of approximately 2 $\mu$m, which is 4% of the sheet thickness. Here, the ratio of the diameter to the axial length of the hole section in one sheet of sheet material 3, that is, the aspect ratio, is approximately 2:1, and the ratio of the distance between the hole sections adjacent to each other to the axial length of the hole section is 1:1. When six sheets of the sheet material 3 are laminated to obtain an industrial part 1, the thickness is 0.3 mm, the ratio of the diameter D to the axial length L of the through-hole section of the industrial part 1, that is, the aspect ratio is roughly 1:3, and the ratio of the distance N between the through-hole sections adjacent to each other to the axial length of the through-hole section becomes 1:6. The through-hole section 2 with such a high aspect ratio may be provided at a clearance for one sheet of sheet material 3, in other words, with a variance in accuracy of within 4 $\mu$m for the diameter D of the through-hole section.

Then, an example of the present invention will be described for confirmation of the advantages.

EXAMPLE

A wiring board was fabricated with a blanking machine including a punch and a die, using a sheet of greensheet with a Young's modulus of 4 kgf/mm$^2$ as the material, so that through-hole sections with a diameter of 80 $\mu$m and an axial length of 0.4 mm were formed at a spacing of 70 $\mu$m between adjacent through-hole sections.

In the above case, the thickness of one greensheet was configured to be 40 $\mu$m, and 10 sheets thereof were laminated with the punch as a lamination axis. After measurement of the diameter of a through-hole section of the obtained wiring board, it was found that it was 80 $\mu$m at the surface side and 80–81 $\mu$m at the back side of the above board. Moreover, observation of the surface and back sides of the above board with an optical microscope confirmed that there were no cracks and so on whatsoever.

Comparative Example 1

A wiring board was fabricated in a similar manner to that of the example 1 except that the thickness of the greensheet was 0.4 mm, and only one greensheet without lamination was used. After measurement of the diameter of a through-hole section of the obtained wiring board, it was found that it was 80 $\mu$m at the surface side and 95–110 $\mu$m at the back side of the above board. Moreover, observation of the surface and back sides of the above board with an optical microscope confirmed that there were deformation of the holes and, cracks at edges of the hole in some through-hole sections.

Comparative Example 2

A wiring board provided with the similar through-hole sections to those of the above example was fabricated, using a laser machining apparatus, and a greensheet with a Young modulus of 4 kgf/mm$^2$ as the material. In a similar manner to that of the Comparative Example 1, only one sheet was used, and the thickness of the sheet used was 0.4 mm. After measurement of the diameter of a through-hole section of the obtained wiring board, it was found that it was 80 $\mu$m at the surface side and 50–69 $\mu$m at the back side of the above board. Moreover, observation of the surface and back sides of the above board with an optical microscope confirmed that there were deformation of the holes, reduced circularity, and burrs and chips at edges of the holes.

Thus, according to the present invention, there may be fabricated industrial parts in which small high-aspect-ratio through-hole sections are formed at high density without deformation and cracks with higher accuracy than that of conventional methods.

As described above, according to the present invention, there may be fabricated industrial parts, where fine through-hole sections, in which the diameter thereof is very small (100 $\mu$m or less), and axial length thereof is longer by a predetermined ratio or more compared with that of their diameters, that is, small high-aspect-ratio through-hole sections are provided at high density with similar accuracy to that of hole sections drilled in one sheet of thin sheet material, even when using soft material which can be deformed. Accordingly, the fabrication method of industrial parts having the above high-aspect-ratio through-hole sections may make it possible to fabricate, for example, desired wiring board and nozzles for discharging liquid. Moreover, it has great advantages in contributing to improved packaging technology for industrial parts, and in delivery of more compact and more convenient products for society.

What is claimed is:

1. A method of forming high aspect ratio through-holes in a workpiece using a punch, a die and a stripper, comprising the steps of:

(i) providing a first sheet having first and second opposing surfaces on a surface of said die;

(ii) moving said punch downwardly toward said die to punch at least one through-hole in said first sheet, said stripper and said first surface of said first sheet being brought into tight contact with one another;

(iii) moving said punch upwardly away from said die, said first surface of said first sheet remaining in tight contact with said stripper and being moved away from the die together with the stripper;

(iv) retracting a tip portion of said punch, said tip portion being slightly drawn in from said second surface of said first sheet and remaining within the punched through-hole;

(v) providing a second sheet having first and second opposing surfaces on said surface of said die;

(vi) moving said punch downwardly toward said die to punch at least one through-hole in said second sheet, said first surface of said second sheet being brought into tight contact with said second surface of said first sheet;

(vii) moving said punch upwardly away from said die, said first surface of said second sheet remaining in tight contact with said second surface of said first sheet, and said first sheet remaining in tight contact with said stripper, wherein said first and second sheets are moved away from the die together with the stripper;

(viii) retracting said tip portion of said punch, said tip portion being slightly drawn in from said second surface of said second sheet and remaining within the punched through-hole; and repeating steps (v)–(viii) to form a plurality of laminated sheets having said through-holes formed therein.

2. The method of forming high-aspect-ratio through-holes in a workpiece according to claim 1, wherein a ratio of D/L is approximately 1:1 to 1:7, D being the diameter of said through-holes, and L being the axial length of said through-holes.

3. The method of forming high-aspect-ratio through-holes in a workpiece according to claim 1, wherein a ratio of N/L is approximately 1:1 to 1:7, N being the distance between adjacent through-holes formed through the workpiece, and L being the axial length of said adjacent through-holes.

4. The method of forming high-aspect-ratio through-holes in a workpiece according to claim 1, wherein the diameter of each of said through-holes is not more than 100 $\mu$m.

5. The method of forming high-aspect-ratio through-holes in a workpiece according to claim 1, wherein the distance between adjacent through-holes formed through the workpiece is not more than 100 $\mu$m.

6. The method of forming high-aspect-ratio through-holes in a workpiece according to claim 1, wherein a bonding agent is applied to the first surface of each of the first and second sheets prior to being placed on the surface of the die.

7. The method of forming high-aspect-ratio through-holes in a workpiece according to claim 1, further comprising a step of inserting a bonding sheet between the first and second sheets.

* * * * *